United States Patent [19]

Hochberg et al.

[11] 4,293,823

[45] Oct. 6, 1981

[54] BALANCED INPUT PHONOGRAPH PREAMPLIFIER CIRCUIT

[75] Inventors: Lindsey S. Hochberg; Montague C. Borland, both of Houston, Tex.

[73] Assignee: Logitek Electronic Systems, Inc., Houston, Tex.

[21] Appl. No.: 70,508

[22] Filed: Aug. 28, 1979

[51] Int. Cl.$^3$ .............................................. H03F 3/45
[52] U.S. Cl. ................................ 330/260; 330/109; 330/294; 330/304; 360/67
[58] Field of Search ................ 330/98, 107, 109, 260, 330/294, 304; 179/1 A, 1 D, 1 F, 100.1 TC, 100.4 A; 333/28 R, 28 T; 360/65, 67

[56] References Cited

U.S. PATENT DOCUMENTS 4,139,825  2/1979  Inoue et al. ...................... 330/294 X

OTHER PUBLICATIONS

Heatun, "CMOS Magnetic Cartridge Pre-Amplifier", *Practical Electronics*, vol. 12, No. 10, p. 823, Oct.1976.

*Primary Examiner*—James B. Mullins

[57] ABSTRACT

A balanced input phonograph preamplifier circuit according to the present invention incorporates a matched differential pair of transistors having a gain control system therefor and having a load matched to standard phonograph cartridge output characteristics by means of a 47,000 ohm resistor and a capacitor that is designed for the particular cartridge involved. A differential voltage amplifier is defined by the matched differential pair of transistors functioning in conjunction with a differential amplifier which is in the form of an operational amplifier functioning in the differential mode. The output signal of the differential voltage amplifier system is processed by a deemphasis network incorporating a voltage amplifier and a current amplifier that are bridged by a feedback loop that is designed specific to the equalization curve of the Record Industry Association of America. Each channel of a stereo phonographic system will incorporate a differential voltage amplifier circuit and a deemphasis network that may be substantially identical.

4 Claims, 3 Drawing Figures

BALANCED INPUT PHONOGRAPH PREAMPLIFIER CIRCUIT

FIELD OF THE INVENTION

This invention relates generally to electronic circuits for phonograph systems and, in particular, stereo phonograph systems, and is more specifically directed to the provision of a balanced phonograph preamplifier circuit system that is basically a low noise preamplifier and, further, is capable of eliminating most interfering signals, such as might be emitted by any nearby electronic apparatus. Even further, the present invention is directed to phonograph preamplifier systems that may be utilized in a commercial environment such as for radio station phonographic systems or in a domestic environment for phonographic systems such as might be utilized in homes.

BACKGROUND OF THE INVENTION

In the manufacture of conventional phonographic cartridges, including cartridges utilized in both commercial and domestic phonographic systems, it is typical for one side of the cartridge coil of a stereo system to be connected to ground, thus resulting in unbalanced phonograph preamplifier circuitry. The unbalanced nature of this preamplifier circuit results in the reception of a certain amount of noise which must be compensated for by the provision of appropriate filtering circuits. In the case of domestic phonograph systems, very little filtering is typically accomplished and therefore domestic phonograph cartridge systems are subject to hum and noise. Phonographic cartridges produce very low level outputs and thus the leads which connect a cartridge to the accompanying preamplifier are very susceptible to hum and noise pick-up. In high-fidelity, low-noise applications, it has traditionally been necessary to minimize the length of these leads and to route the leads carefully so as to reduce hum pick-up from nearby radiating alternating current fields. Accordingly, preamplifiers are mounted as near as possible to phonographic cartridges, often in awkward, hard to service locations, with unpredictable results.

Microphones also have low-level outputs, but microphone preamplifiers are generally designed to eliminate hum pick-up through the use of balanced-input circuitry, which electronically cancel any noise that is induced on both leads coming from the microphone. Tradiationally, an input transformer has been utilized as the input balancing component. Because common phonographic cartridges, unlike microphones, must be terminated by high-impedance, low-inductance loads, input transformers are impractical for use in phonographic preamplifiers.

The development of new low-noise transistors has promoted the use of transformerless, balanced-input circuits as replacements for transformers in microphone preamplifier designs. Such designs use differential amplifiers to eliminate input-noise. Differential amplifiers have virtually no inductance and can be designed with the proper input impedance to load phonographic cartridges, making possible their use in phonographic preamplifiers.

In view of the foregoing, it is a primary feature of the present invention to provide a novel, balanced phonographic preamplifier circuit that eliminates the susceptibility to noise and hum that is often associated with unbalanced phonographic preamplifier circuits.

It is another feature of this invention to provide a novel balanced-input preamplifier circuit for phonographs which can be efficiently employed with either balanced or unbalanced input signals.

It is another feature of this invention to provide a novel balanced-input preamplifier circuit for phonographs that effectively eliminates any radio frequency noise even under circumstances, such as in radio stations, wherein the phonograph system is located near a radio transmitter and might otherwise be susceptible to transmitter noise.

It is an even further feature of this invention to provide a novel, balanced-input preamplifier circuit wherein a feedback loop is employed that is substantially isolated from the phonographic cartridge.

Among the several objects and features of this invention is contemplated the provision of a novel, balanced-input preamplifier circuit for phonograph systems that is equally applicable to phonographic preamplifiers having variable gain controls or variable equalization controls.

Other and further objects, advantages and features of this invention will become obvious to one skilled in the art upon an understanding of the illustrative embodiment about to be described and various advantages, not referred to herein, will occur to one skilled in the art upon employment of the invention in practice.

SUMMARY OF THE INVENTION

The present invention is directed to the provision of a balanced-input preamplifier circuit for phonographic systems, and especially phonographic systems having stereo circuit components such as for driving right and left channel speaker systems. In the case of each channel of the phonographic circuitry there is provided a differential voltage amplifier system incorporating a matched differential pair of transistors that incorporate an adjustable current source for regulating the gain and biasing of the first stage device. In order to match the standard cartridge output characteristics of typical phonographic cartridges, the input of the matched differential pair of transistors is loaded with a 47,000 ohm matching resistor and a capacitor having low capacitance as compared to the standard capacitance for phonographic cartridges. The differential voltage amplifier includes a differential amplifier which may be an operational amplifier functioning in the differential mode. The output signal of the differential voltage amplifier of each channel is respectively transmitted to a deemphasis network that is designed specifically in accordance with the equalization curve of the Record Industry Association of America (RIAA). The RIAA deemphasis network incorporates a voltage amplifier with the output thereof coupled to a current amplifier and a feedback loop that, together with the voltage and current amplifiers, function particularly in the form of a low pass filter. The amplified and filtered signal of the RIAA deemphasis network is then subjected to a load that is designed for the particular use involved. The design of this circuitry, while not critical from the design standpoint, is appropriate to create a standard line level output at approximately 600 ohms impedance to match commercial grade mixing systems. As a design alternative, for example, a transformer may be employed having a high impedence secondary. As a further alternative, the output transformer may be eliminated entirely along with the associated current amplifier. The output side of the feedback loop is in that case attached around the voltage amplifier, the output then taken directly from the voltage amplifier together with the isolation components thereof, such as a decoupling resistor/capacitor network. In the case of consumer phonographic systems such as are utilized in homes, for example, a high impedence output would be required and the output stage of 600 ohms or so would be eliminated together with the current amplifier that drives the output stage.

The balanced-input circuitry described above may be driven by a suitable power supply system such as a power supply system having well regulated symmetrical voltages. By employing electronic voltage regulator circuitry fed by a conventional transformer and by coupling to the voltage regulators a series set of parallel, shunt zener diodes through dropping resistors.

BRIEF DESCRIPTION OF THE DRAWINGS

In order that the manner in which the above-recited advantages, objects and features of this invention are attained and can be understood in detail, more particular description of the invention, briefly summarized above, may be had by reference to the specific embodiment thereof that is illustrated in the appended drawings, which drawings form a part of this specification. It is to be understood, however, that the appended drawings illustrate only a typical embodiment of this invention and therefore are not to be considered limiting of its scope, for the invention may admit to other equally effective embodiments.

In the Drawings.

DETAILED DESCRIPTION OF PREFERRED EMBODIMENT

Figure 1:
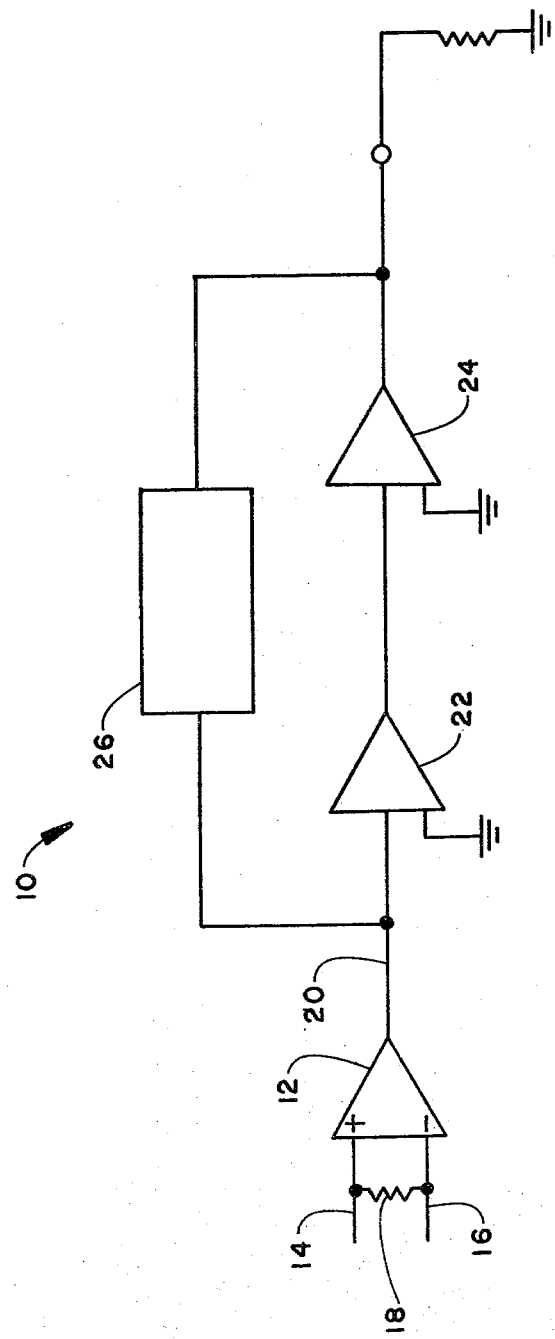
FIG. 1 is a general electronic schematic diagram identifying a balanced phonographic preamplifier circuit constructed in accordance with the present invention.

Referring now to the drawings and first to FIG. 1, a balanced phonographic preamplifier circuitry is illustrated in block diagram form, generally at 10, and incorporating a differential voltage amplifier 12 to which inputs 14 and 16 are coupled. For the purpose of matching the output of a standard phonographic cartridge, a 47,000 ohm resistor 18 is coupled across the input conductors 14 and 16. The output 20 of the differential voltage amplifier is then connected to a voltage amplifier 22 which is in turn connected to a current amplifier 24. The voltage and current amplifiers are bridged by means of a feedback network 26 that cooperates with the voltage and current amplifiers to function in the form of a low pass filter with the specific characteristics specified by the RIAA for deemphasis of signals received from phonographic recordings.

Figure 2:
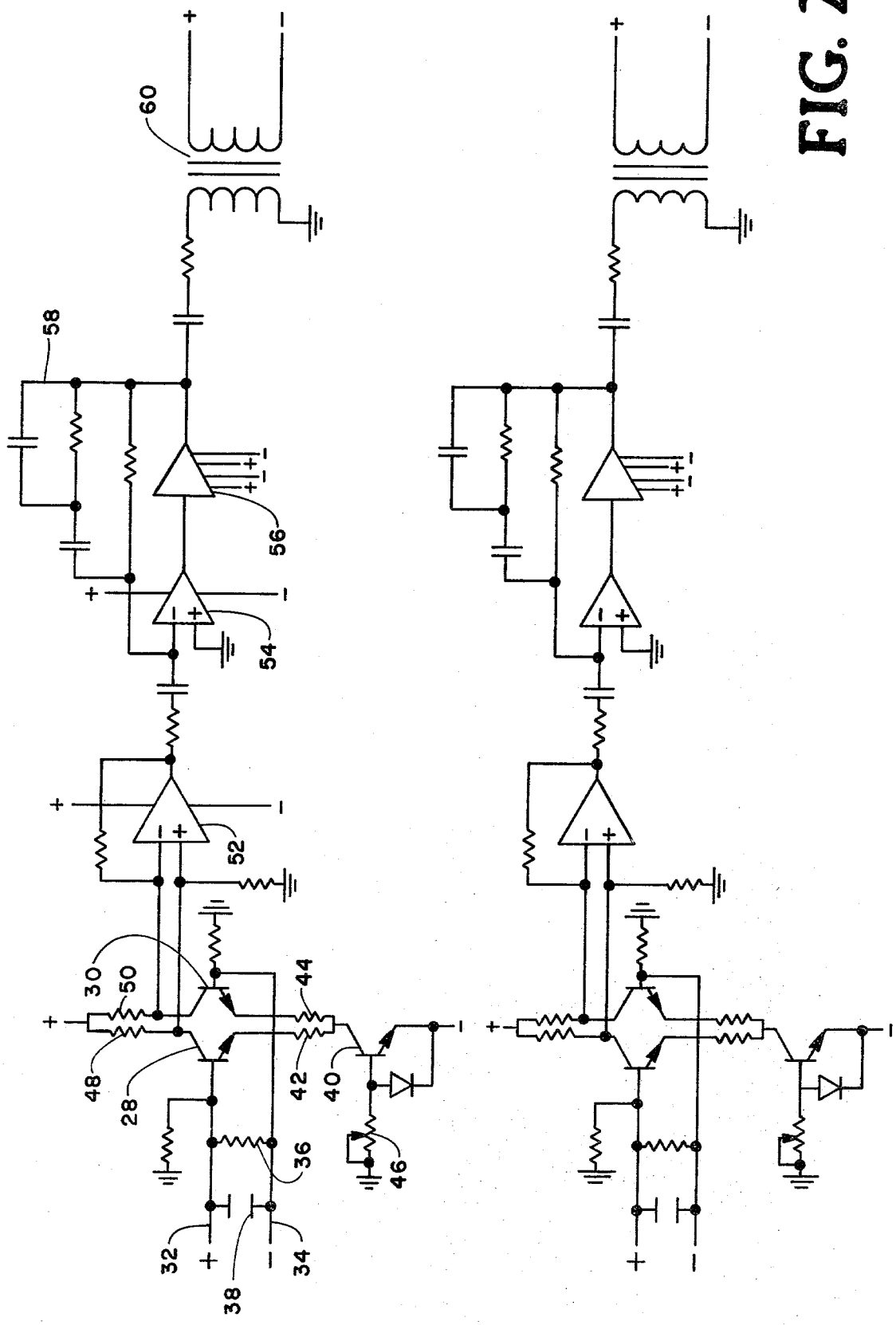
FIG. 2 is a detailed electronic circuit diagram identifying the circuit components of the right and left channels of a balanced phonographic preamplifier circuit constructed in accordance with the present invention.

The block diagram circuitry of FIG. 1 illustrates one channel of a phonographic preamplifier circuit and, of course, would be duplicated under circumstances where a high-fidelity, stereo phonographic system is involved. In the case of FIG. 2, the phonographic preamplifier circuitry is shown in greater detail and each of the left and right channels are shown with the left channel being shown at the upper portion of the figure. Since the electronic circuitry of each of the channels is substantially identical, only the circuitry of the upper or left channel is described in detail for purposes of simplicity. The differential voltage amplifier incorporates a matched differential pair of transistors including transistors 28 and 30 and which are interconnected in differential relation to the input conductors 32 and 34. In order to match the load of a standard phonographic cartridge, a load of 47,000 ohms is introduced by means of a load resistor 36 that is coupled to input conductors 32 and 34. A low-capacitance capacitor 38 is also coupled to input conductors 32 and 34. The value of this capacitor is low relative to the standard load capacitance for phonographic cartridges. A current supply for the matched differential pair of transistors 28 and 30 incorporates a transistor 40 that is coupled to a suitable current supply source such as in this circuit —13 volts D.C. and also coupled in parallel to emitter resistors 42 and 44. A variable resistor 46 is adjustable to set the gain and biasing of the amplifier system defined by the matched differential pair of transistors by regulation of the current from the current source. Collector resistors 48 and 50 are coupled in parallel with a suitable current source, such as +13 volts D.C. in this case, to provide current bias across the transistors 28 and 30. A voltage which is the summation of the amplified input signal and the D.C. voltage created by the flow of bias current through resistors 48 and 50 is applied to the inputs of amplifier 52. Amplifier 52, which is a differential amplifier, cooperates with the matched differential pair of transistors 28 and 30 to define the differential voltage amplifier identified at 12 in FIG. 1. The amplifier circuit 52 may be in the form of an operational amplifier that is used in the differential mode.

The output of the differential voltage amplifier circuitry is provided at the input of a voltage amplifier 54 with the output of voltage amplifier 54 being input to a current amplifier 56. Coupled across the series connected amplifier circuits 54 and 56 is an RIAA deemphasis network 58 which is of conventional form. It is necessary to provide an output load of approximately 600 ohms. This is accomplished in the case of the circuitry of FIG. 2 by providing a transformer 60 that is driven by the current amplifier 56. Under circumstances where the preamplifier circuitry is to be employed in consumer systems such as are utilized in the domestic environment, the 600 ohm load and the current amplifier driving load would be deleted from the circuitry.

Figure 3:
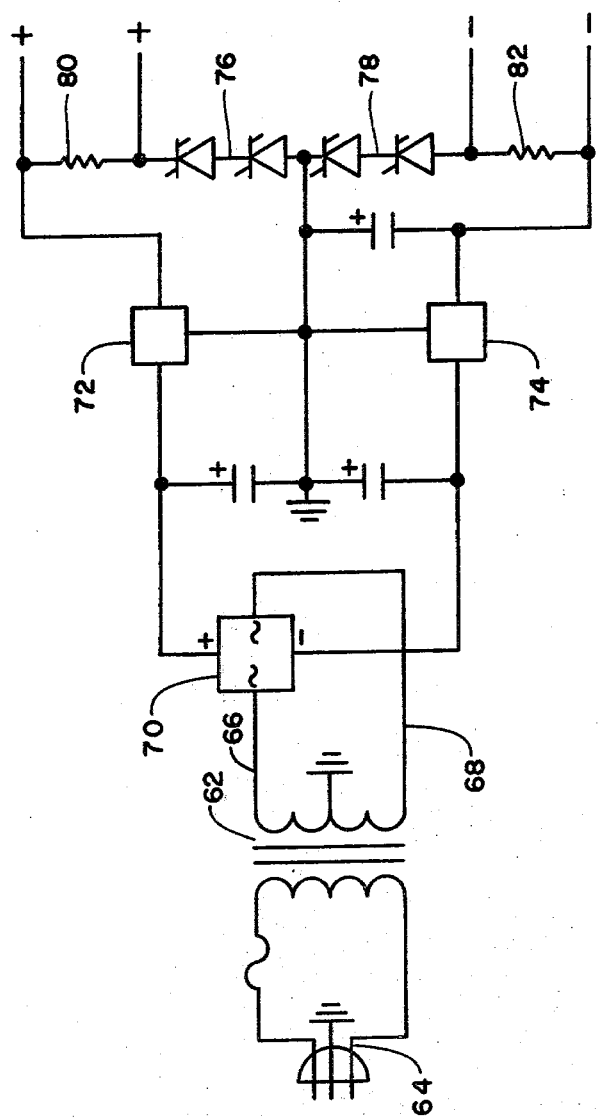
FIG. 3 is an electronic schematic diagram identifying a power supply circuit that may be utilized in conjunction with the circuitry of FIG. 2 as a power supply system for the balanced phonographic preamplifier circuitry.

In phonograph preamplifier circuits it is desirable to provide a power supply system having well regulated symmetrical voltages. Such a power supply source is identified in FIG. 3 and which incorporates a transformer 62 that is connected by a conductor system 64 to a suitable source of alternating current. The output conductors 66 and 68 of the transformer 62 are coupled to a voltage regulator system incorporating a full wave bridge rectifier 70, voltage regulators 72 ad 74. Capacitors 75 function as filters to filter one wave of the alternating current. Chains of zener diodes 76 and 78 are coupled to dropping resistors 80 and 82 that are in turn coupled to the output conductors of the voltage regulators 72 and 74.

In view of the foregoing, it is apparent that the present invention is one well adapted to attain all of the objects and advantages hereinabove set forth, together with other advantages which will become obvious and inherent from a description of the apparatus itself. It will be understood that certain combinations and subcombinations are of utility and may be employed without reference to other features and subcombinations. This is contemplated by and is within the scope of the present invention.

As many possible embodiments may be made of this invention without departing from the spirit or scope thereof, it is to be understood that all matters hereinabove set forth or shown in the accompanying drawings are to be interpreted as illustrative and not in any limiting sense.

What is claimed is:

1. A balanced-input preamplifier circuit for phonographs for use with balanced and unbalanced input signals, said preamplifier circuit comprising:
    a differential voltage amplifier having a pair of inputs adapted to be coupled to the output of a phonograph cartridge having a pair of sides, one of said inputs being connectable to one of said sides and the other of said inputs being connectable to the other of said sides without referencing either of said inputs to ground;
    an input load resistance being coupled to said differential voltage amplifier, said load being applied to the output of a phonographic cartridge to which said preamplifier circuit is connected;
    a voltage amplifier having the input thereof coupled to the output of said differential voltage amplifier and the output thereof adapted to be interconnected with other amplifier circuitry of said phonograph;
    a feedback loop network bridging said input and output of said voltage amplifier, said feedback loop network being isolated from said cartridge and being designed in accordance with the specific curve characteristics specified by the Record Industry Association of America for deemphasis of signals received from phonographic recordings.

2. A balanced-input preamplifier circuit as recited in claim 1, wherein said circuitry includes:
    a current amplifier having the input thereof coupled with the output of said voltage output;
    a load being interconnected in driven relation by the output of said current amplifier; and
    said feedback loop bridging both said voltage amplifier and said current amplifier.

3. A balanced-input preamplifier circuit as recited in claim 2, wherein:
    said load is defined by a transformer having one winding coupled to said output of said current amplifier and a second winding.

4. A balanced-input preamplifier circuit as recited in claim 1, wherein said differential voltage amplifier comprises:
    a matched differential pair of transistors;
    a current source interconnected with said matched differential pair of transistors and being adjustable to set the gain and bias of said differential voltage amplifier; and
    a differential amplifier having the input thereof coupled to the collectors of said matched differential pair of transistors and having the output thereof coupled to said input of said voltage amplifier and coupled to said feedback loop.

* * * * *